(12) United States Patent
des Gaschons

(10) Patent No.: US 8,957,685 B2
(45) Date of Patent: Feb. 17, 2015

(54) ELECTRICAL POWER SOURCE BATTERY TESTER

(76) Inventor: Gilles Peyrot des Gaschons, Warren, NJ (US)

( * ) Notice: Subject to any disclaimer, the term of this patent is extended or adjusted under 35 U.S.C. 154(b) by 497 days.

(21) Appl. No.: 13/433,781

(22) Filed: Mar. 29, 2012

(65) Prior Publication Data
US 2012/0249153 A1 Oct. 4, 2012

Related U.S. Application Data

(60) Provisional application No. 61/471,361, filed on Apr. 4, 2011.

(51) Int. Cl.
*G01N 27/416* (2006.01)
*G01R 31/36* (2006.01)

(52) U.S. Cl.
CPC .................................. *G01R 31/3637* (2013.01)
USPC .......................................... 324/435; 324/437

(58) Field of Classification Search
CPC ............... Y02E 60/12; G01R 31/3686; G01R 31/3682; G01R 31/3627; G01R 31/3696; G01R 31/36; H01M 6/505; H01M 10/448
USPC ......................................................... 324/435
See application file for complete search history.

(56) References Cited

U.S. PATENT DOCUMENTS

| | | | | |
|---|---|---|---|---|
| 4,145,648 A * | 3/1979 | Zender | .......................... | 320/105 |
| 4,447,785 A * | 5/1984 | Wright | .......................... | 320/105 |
| 4,488,147 A * | 12/1984 | Signorile | ................... | 340/636.1 |
| 4,667,141 A * | 5/1987 | Steele | ........................... | 320/105 |
| 4,803,459 A * | 2/1989 | Ta | ................................. | 340/459 |
| 6,163,156 A * | 12/2000 | Bertness | ....................... | 324/426 |
| 6,359,442 B1 * | 3/2002 | Henningson et al. | .......... | 324/426 |
| 6,586,941 B2 * | 7/2003 | Bertness et al. | ............... | 324/426 |
| 6,988,053 B2 * | 1/2006 | Namaky | ........................ | 702/183 |
| 7,598,743 B2 * | 10/2009 | Bertness | ........................ | 324/426 |
| 7,642,786 B2 * | 1/2010 | Philbrook | ...................... | 324/426 |
| 8,072,341 B2 * | 12/2011 | Sheng | .......................... | 340/636.1 |
| 8,788,226 B2 * | 7/2014 | Sheng et al. | .................... | 702/63 |
| 2004/0056635 A1 * | 3/2004 | Chang | ............................ | 320/105 |
| 2006/0192524 A1 * | 8/2006 | Lin | ................................. | 320/105 |

* cited by examiner

*Primary Examiner* — Arun Williams
(74) *Attorney, Agent, or Firm* — Craig M. Bell; Bell IP Law

(57) ABSTRACT

An electrical charge detection device for measuring the electrical charge of a dry cell battery comprises electrically conductive arms joined with a rivet pin at their proximal ends with curved tips at their distal ends. The junction formed by the proximal ends has a light source mounted on the planar top surface and is in electrical contact with the pin. The curved tips at the distal ends of the arms are angled to form inward curved prongs that connect with the polar ends of a power source such as a battery. When the arms are squeezed together, one tip contacts the cathode of the battery and the other touches the anode so that any charge in the battery will travel up the arms thereby lighting the bulb. The degree of brightness illuminated by the bulb is indicative of the electrical strength or power remaining therein.

11 Claims, 2 Drawing Sheets

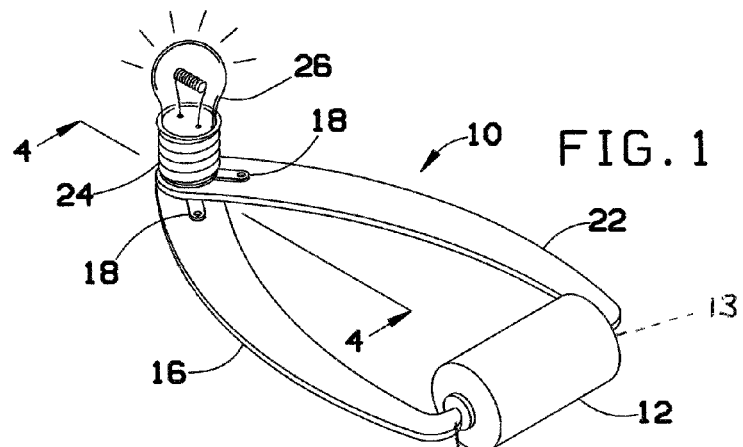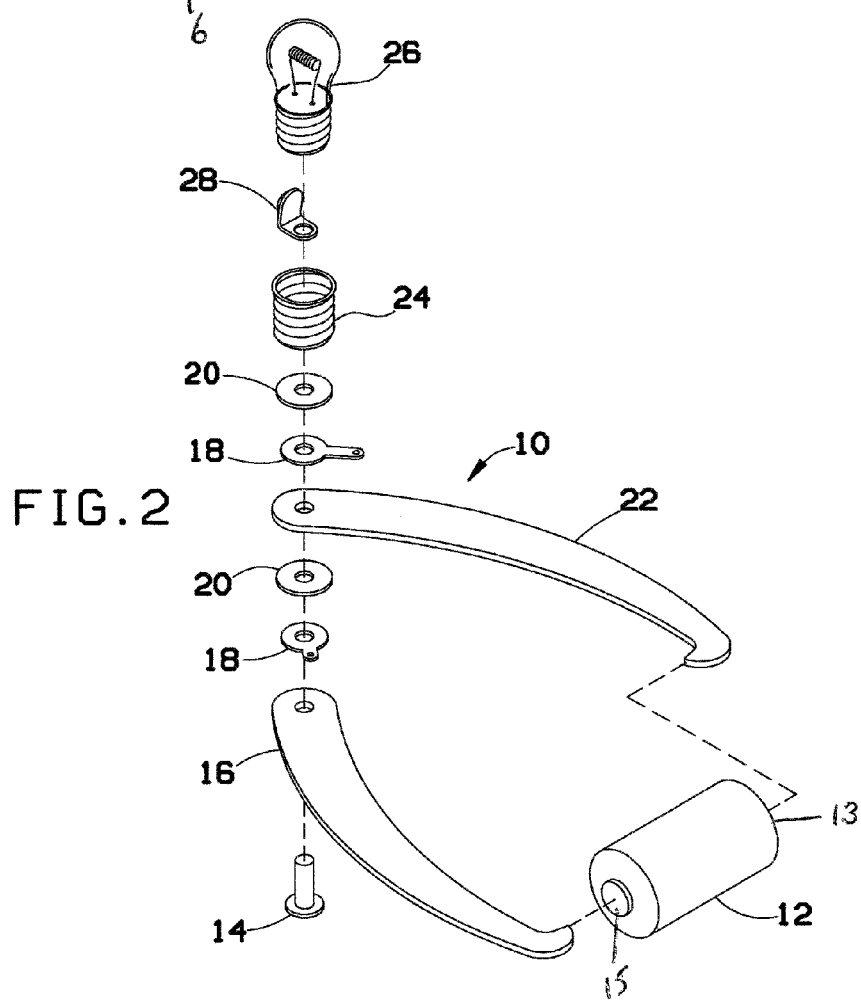

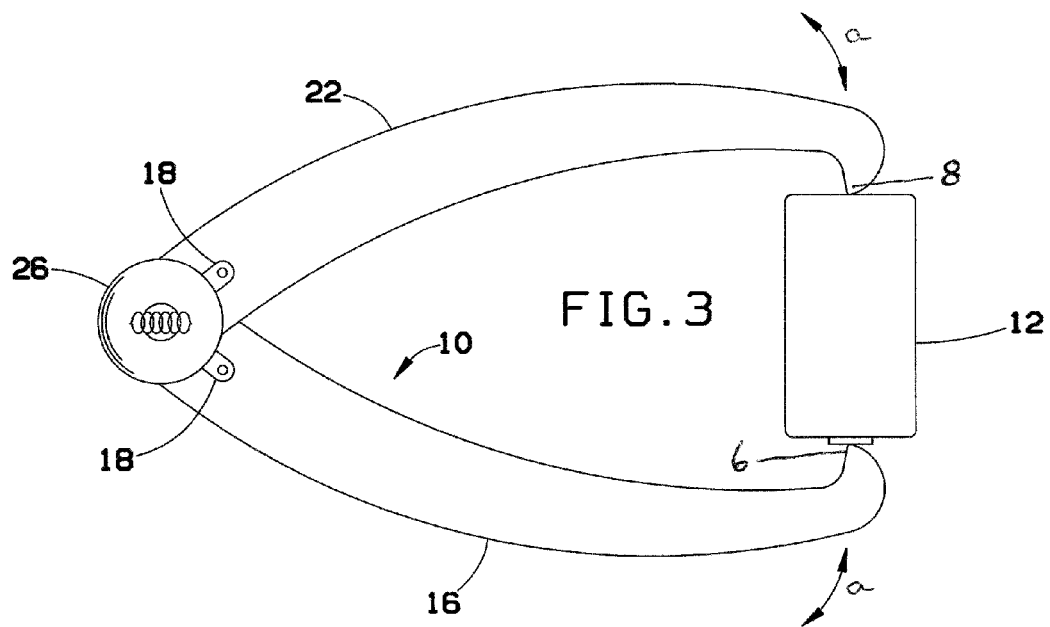
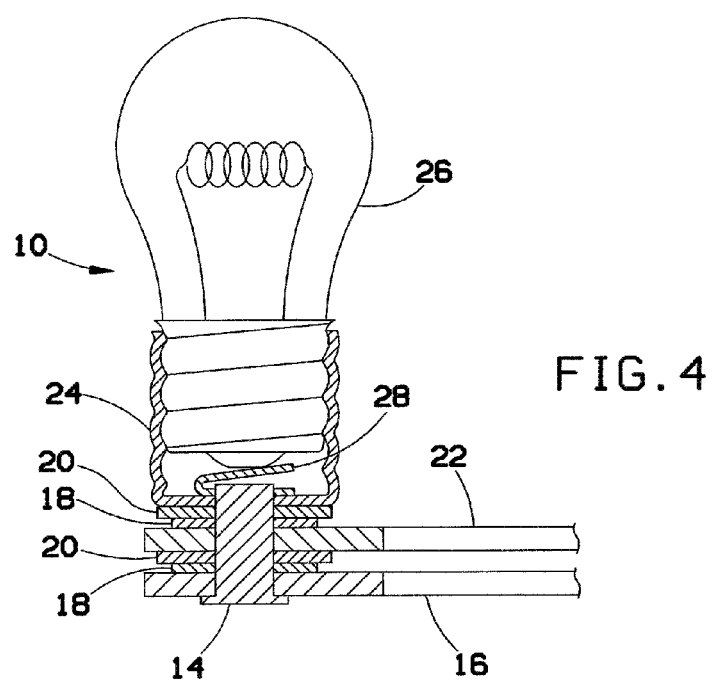

ELECTRICAL POWER SOURCE BATTERY TESTER

RELATED APPLICATIONS

The present application is the utility filing of U.S. Provisional Patent application Ser. No. 61/471,361 filed on Apr. 4, 2011.

FIELD OF THE INVENTION

The present invention relates generally to dry cell batteries and means to detect their power supply and power life expectancy. More specifically, the present invention relates to a means to test and visually inspect strength or vitality of the electric voltage contained in a dry cell battery.

BACKGROUND OF THE INVENTION

Flashlights, portable lanterns, portable radios and television, cameras, video recorders, portable dictating machine, remote controls, alarm clocks, toys, hearing aids, and the like are used extensively in this country and abroad. Almost every home and business has at least one flashlight or portable lantern and a radio. Many home and businesses have numerous devices, such as recorders, portable radios and televisions, video recorders, calculators, cameras, and the like, which utilize batteries for their energy source. Some of the devices, such as flashlights, are used on an infrequent basis, that is, during an emergency situation where there has been a power failure or when it is not convenient to use a light source powered by conventional household current, such as for outdoor use or use in an unlighted attic or crawl space. Other devices, such as portable radios, are used extensively. The majority of these battery powered devices use dry-cell non-rechargeable batteries. Nonrechargeable alkaline batteries sold under the trademarks EVEREADY, DURACELL, RAYOVAC, and the like, have a number of advantages over rechargeable batteries. On a weight-to-weight and volume-to-volume basis, the alkaline battery can supply three to four times the wattage of a rechargeable battery. In addition, non-rechargeable, dry-cell batteries put out a higher voltage than dry-cell rechargeable batteries. Many dry-cell rechargeable batteries, even if not in use, have to be periodically charged to keep the batteries from falling below a defined charge level to prevent permanent damage to the batteries. Alkaline batteries, which are used frequently, can have a shelf or storage life of from three to five years. During this period, no maintenance of the battery is required. In contrast, most rechargeable batteries wet-cell and dry-cell will completely discharge within six months or less of their last recharge.

Dry cell batteries convert chemical energy directly to electrical energy and consist of a number of voltaic cells; each voltaic cell consists of two half-cells connected in series by a conductive electrolyte containing anions and cations. An electrolyte is any substance containing free ions that make the substance electrically conductive. The most typical electrolyte is an ionic solution, but molten electrolytes and solid electrolytes are also possible. Commonly, electrolytes are solutions of acids, bases or salts. Furthermore, some gases may act as electrolytes under conditions of high temperature or low pressure. Electrolyte solutions can also result from the dissolution of some biological (e.g., DNA, polypeptides) and synthetic polymers (e.g., polystyrene sulfonate), termed polyelectrolytes, which contain charged functional groups.

Electrolyte solutions are normally formed when a salt is placed into a solvent such as water and the individual components dissociate due to the thermodynamic interactions between solvent and solute molecules. As an example, when table salt, NaCl, is placed in water, the salt (a solid) dissolves into its component ions, according to the dissociation reaction

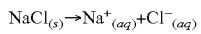
$$NaCl_{(s)} \rightarrow Na^+_{(aq)} + Cl^-_{(aq)}$$

It is also possible for substances to react with water producing ions, e.g., carbon dioxide gas dissolves in water to produce a solution which contains hydronium, carbonate, and hydrogen carbonate ions. Electrolytic conductor compounds can be formulated to create a chemical reaction at a metal/electrolyte interface. In batteries, two materials with different electron affinities are used as electrodes; electrons flow from one electrode to the other outside of the battery, while inside the battery the circuit is closed by the electrolyte's ions. Here the electrode reactions convert chemical energy to electrical energy. One half of the battery comprises the electrolytic portion and the electrode to which anions (negatively charged ions) migrate, i.e., the anode or negative electrode. The other half of the battery includes electrolyte and the electrode to which cations (positively charged ions) migrate, i.e., the cathode or positive electrode. In the redox reaction that powers the battery, cations are reduced (electrons are added) at the cathode, while anions are oxidized (electrons are removed) at the anode. The electrodes do not touch each other but are electrically connected by the electrolyte. Some cells use two half-cells with different electrolytes. A separator between half-cells allows ions to flow, but prevents mixing of the electrolytes.

Each half-cell has an electromotive force (or emf), determined by its ability to drive electric current from the interior to the exterior of the cell. The net emf of the cell is the difference between the emfs of its half-cells. Therefore, if the electrodes have emfs $\epsilon_1$ and $\epsilon_2$, then the net emf is $\epsilon_2-\epsilon_1$; in other words, the net emf is the difference between the reduction potentials of the half-reactions.

The electrical driving force or $\Delta V_{bat}$ across the terminals of a cell is known as the terminal voltage (difference) and is measured in volts. The terminal voltage of a cell that is neither charging nor discharging is called the open-circuit voltage and equals the emf of the cell. Because of internal resistance, the terminal voltage of a cell that is discharging is smaller in magnitude than the open-circuit voltage and the terminal voltage of a cell that is charging exceeds the open-circuit voltage. An ideal cell has negligible internal resistance, so it would maintain a constant terminal voltage of $\epsilon$ until exhausted, then dropping to zero. If such a cell maintained 1.5 volts and stored a charge of one coulomb then on complete discharge it would perform 1.5 joule of work. In actual cells, the internal resistance increases under discharge, and the open circuit voltage also decreases under discharge. If the voltage and resistance are plotted against time, the resulting graphs typically are a curve; the shape of the curve varies according to the chemistry and internal arrangement employed.

As stated above, the voltage developed across a cell's terminals depends on the energy release of the chemical reactions of its electrodes and electrolyte. Alkaline and zinc-carbon cells have different chemistries but approximately the same emf of 1.5 volts; likewise NiCd and NiMo cells have different chemistries, but approximately the same emf of 1.2 volts. On the other hand the high electrochemical potential changes in the reactions of lithium compounds give lithium cells emfs of 3 volts or more.

Alkaline batteries are a type of primary batteries dependent upon the reaction between zinc and manganese dioxide (Zn/$MnO_2$). A rechargeable alkaline battery allows reuse of specially designed cells. Compared with zinc-carbon or zinc chloride batteries types, alkaline batteries have a higher energy density and longer shelf-life, with the same voltage. Button cell silver-oxide batteries have higher energy density and capacity but also higher cost than similar-size alkaline cells. The alkaline battery gets its name because it has an alkaline electrolyte of potassium hydroxide, instead of the acidic ammonium chloride or zinc chloride electrolyte of the zinc-carbon batteries. Other battery systems also use alkaline electrolytes, but they use different active materials for the electrodes.

Alkaline batteries account for 80% of manufactured batteries in the US and over 10 billion individual units produced worldwide. Unfortunately, many are often only partially used or taken out of their original packaging and then put aside for long periods of time only to be later discovered by the consumer who, at this point in time has no idea whether or not the battery has any useful electric charge left. Many are often discarded with the belief they are spent and "dead" when in reality there is a substantial amount of electric power remaining therein. On the other hand, often times a battery or batteries may by employed in a device when in fact they are used up or "spent" and the device then doesn't work when needed. It would be useful then to be able to readily and simply ascertain the condition of a dry cell storage battery and the amount, if any of charge left therein if the age or prior degree of use thereof is unknown. Battery testers known in the art require the use of relatively large, bulky devices and use a more expensive volt-meter that may not reflect the real "working capacity" or remaining energy of the battery tested. The present invention is comprised of essentially four key parts: two metal arms or claws, one bulb casing or light connector and one light-emitting device (here presented with an incandescent bulb). Battery testers known in the art must generally use volt-meters comprised of a bulky screen with a large plastic casing. This assembly requires expensive parts that may not be recycled when the tester is broken Known testers may indicate that the battery still has power, but when put into a device, the battery doesn't deliver its expected energy. The present invention shows that a battery has a charge by lighting a small bulb connected within an electrical circuit created by the arms. If there is still energy in the battery, the light goes on, if there is no energy left in the battery, the bulb does not. The amount of electric power remaining in the alkaline cell is also shown. If the bulb is dim, the energy is low, if it is bright, the battery is still in a well charged condition. It visually permits the tester to see how much energy is left in the tested battery.

U.S. Pat. No. 7,039,533 to Bertness et. al teaches a storage battery that includes a battery test module mounted to the battery housing and electrically coupled to the terminals through Kelvin connections. A display is configured to output battery condition information from the battery test module. Battery post extensions couple the battery test module to terminals of the battery.

U.S. Pat. No. 6,347,958 to Tsai et. al teaches a connecting device attachable to a battery terminal that can display the electrical condition, such as the voltage of power and the condition of the fuses of each line. The connecting device includes a main body having a clamp at one end for fixing to the battery terminal, and the other end for carrying a display unit and connecting cables of appliances. The display unit makes the connecting device displayable with electrical conditions directly without the need of using other testing devices.

U.S. Pat. No. 6,332,133 also to Bertness et. al. discloses a device for testing a battery, comprising a measurement circuitry adapted to apply a signal to cells of the battery and measure a response signal of the cells that make up the battery; and a microprocessor coupled to the measurement circuitry adapted to determine a statistical parameter of a first portion of a string of cells that make up the battery as a function of the response signal, measure a first dynamic parameter of a second portion of the string of cells that make up the battery as a function of the response signal, and provide an output based upon a comparison of the statistical parameter to the dynamic parameter.

U.S. Pat. Nos. 6,614,333; 6,612,151 and 5,607,790 to Hughen et. al. teaches packaging for the commercial sale of one or more alkaline battery cells. The packaging is comprised of a label/tester composite. The batteries are removable from the packaging and the alkaline cell has positive and negative terminals and a metal housing with a cylindrical wall. The label/tester composite comprises film packaging with a thermo-chromic material disposed on the side thereof. By pushing in on the ends of the packaging by the (+/−) terminals of a battery in said packaging, charge generated from the battery causes the thermo-chromic material to react and change color, indicating whether the battery tested has charge, and if so, how much. The battery tester is part of and integral with the commercial packaging which is disposable. All of the above devices useful in measuring the charge of a dry cell battery are relatively complex articles comprised of multiple parts designed for use by engineers and non-layman type individuals. They are certainly not easily used by children U.S. Pat. No. 6,049,210 to Huang discloses a device for displaying the remaining capacity of a rechargeable battery. The device comprises a current sensing resistor connected between an external power source and the rechargeable battery, for sensing a charge current and a discharge current of the rechargeable battery. A current-to-frequency converter converts the charge and discharge currents into first and second count signals having first and second toggle frequencies. A microprocessor compares the first and second frequencies with a predetermined frequency, to measure the remaining capacity of the rechargeable battery and generate display data accordingly. A display device displays the remaining capacity of the battery The present invention provides an alkaline battery cell tester that comprises a simple and quick means to measure the electric charge of an alkaline power battery. The tester device measures not only whether the alkaline cell battery has any electric charge remaining, but how much electro-chemical power remains therein. Nickel-cadmium, lithium on, re-chargeable alkaline cells commercially known as AA, AAA, C, D standard sizes as well as other lithium dime configurations known in the art from 1.5 volts up to 9 volts may be tested. New, unused batteries can be distinguished from slightly used but still charged batteries while un-charged, "dead" batteries can be determined and thrown away.

More specifically, the present invention comprises a scissors-shaped alkaline battery power tester is comprised of two (2) pincer or claw-like flanges that are pivotally attached to each other towards the central portion of each. The distal ends of each flange are formed as substantially right-angled, arched-shaped points so that when brought together through the compression of the two proximal ends, each simultaneously contacts the either the anode or the cathode of an alkaline battery cell. In that way, the dry cell alkaline battery and the arms create an electrical circuit or path in which electrons from the battery can flow. A light bulb attached within the circuit is illuminated thereby and the degree of illumination is directly correlated to the amount of charge in the circuit.

BRIEF DESCRIPTION OF THE DRAWINGS

FIG. 1 is an overall perspective view of the battery charge detector of the present invention shown in use with a disposable alkaline battery.

FIG. 2 is an exploded perspective view of the invention.

FIG. 3 is an elevated top view of the present invention.

FIG. 4 is a section view of the invention taken along line 4-4 in FIG. 1.

SUMMARY OF THE INVENTION

The present invention provides an alkaline battery cell charge indicator monitor that comprises a simple and quick means to measure the electric charge of an alkaline power battery. The tester device measures not only whether the alkaline cell battery has any electric charge remaining, but how much electro-chemical power remains therein. The invention comprises a two-pronged, electrically conductive claw-shaped flange that is centrally pivoted, with distally disposed tips that contact the positive anode and the negative cathode of the alkaline cell. Centrally disposed near the pivoting hinge is a contact that completes a circuit and secures a bulb that indicates the degree of electric charge within the battery through then brightness emitted. Therefore, the device can accurately display the remaining capacity and charging state of the alkaline battery, without needing an expensive A/D converter or other elements.

DETAILED DESCRIPTION OF THE INVENTION

The present invention provides an alkaline battery cell charge indicator monitor that comprises a simple and quick means to measure the electric charge of an alkaline power battery. The tester device measures not only whether the alkaline cell battery has any electric charge remaining, but how much electro-chemical power remains therein. Nickel-cadmium, lithium on, re-chargeable alkaline cells commercially known as AA, AAA, C, D standard sizes as well as flat "button" style batteries and rectangle ones from 1.5 volts up to 9 volts may be tested. New, unused batteries can be distinguished from slightly used but still charged batteries while un-charged, "dead" batteries can be determined and thrown away. The invention comprises a two-pronged electrically conductive flange that is centrally pivoted with distally disposed tips that contact the positive anode and the negative cathode of the alkaline cell. Centrally disposed near the pivoting hinge is a contact that completes a circuit and secures a bulb that indicates the degree of electric charge within the battery through then brightness emitted.

More specifically, the present invention consists of an electrical charge detection device comprising at least two pivotally-movable, electrically conductive arms joined with a rivet pin at their proximal ends. The arms are claw-like in character with curved tips at their distal ends. The device further comprises a light source mounted on the planar top surface of the proximal end of a first upper arm. The light source is in contact with said pin as the pin is upwardly inserted through a hole or channel that is incorporated in the proximal ends of both arms. There is also at least one rubber washer, preferably two (2) disposed between the proximal ends of said arms with a hole in middle for passage of said pin. At least one metal clip or contact is disposed between the washer and the interior planar surface of the first upper arm and a second clip is disposed above the inner planar surface of the second lower arm that is contiguous with said pin and has a second hole for passage of said pin. The curved tips at the distal ends of the electrically conductive flanges or arms are equivalently angled to form inward curved prongs that will connect with each polar end of a power source, again giving the arms their "claw-like" appearance or character.

The electrically conductive arms pivot about the vertical axis of said pin and the rivet pin connects and moveably fastens said first upper and the second lower conductive arm to the light source which comprises an electrical socket receptacle for the removable insertion of a light bulb or other light emitting device base that illuminates upon the passage of an electrical charge from the distal ends of said first and second arms.

Referring now to FIG. 1, one embodiment of present invention 10 is shown operably-connected to an alkaline battery cell 12 to be tested. The indicator is comprised of two arched-shaped flanges or arms 16, 22 that are essentially identical mirror images of each other and are super-imposable upon one another. As can be seen from the drawing, the flanges are essentially planar comprised of a thin, but rigid, conductive metal material and are connected to one another at their proximal ends 3, 5 by a pivot-able pin member or rivet 14. The ends are connected such that the arms are outwardly and inwardly moveable as indicated by the arrows a in FIG. 3 (discussed herein) below but are not loosely connected as will be herein described. The rivet 14 connects the arms as it is inserted through holes in the proximal ends of the arm wherein a battery power charge indicator bulb 26 is also attached by way of an electrical conduit socket assembly 24, the components of which will be more specifically defined in FIG. 2. Two substantially oblong contact shields 18a, 18b are secured to the upper planar surface of each arm 16, 22 and secure the socket assembly 24 and indicator bulb 26 to the junction 3 of the moveable arms 10, 16 so as to provide an electrical conduit for the charge.

Referring again to FIG. 1, the distal ends of the clamp formed by the moveable claw-like arms or flanges 16, 22 form pointed tips or ends 6, 8 which are positioned to make contact with the cathode (13, not shown) and the anode 15 so as to conduct any electric charge when in use to measure the voltage remaining in a dry cell or diode battery. The pointed tips 6, 8 are generally hook-like in shape and preferably form right angles to the longitudinal axis of the arms as defined by line 4-4. When the movable arms 16, 22 are moved towards one another and an alkaline battery cell 12 is placed there between, the tips contact the anode and cathode of the battery and an electrical circuit is created. Any positive charge existing within the alkaline cell is released from the anode of the cell and is conducted through the metal arms 16, 22 to the light bulb base which then illuminates the bulb. The degree of illumination or brightness given off by the bulb is a direct function of, and correlated to amount or degree of electrical charge contained within the battery that is released through the metallic conductive arms. The claw-like arms can be made from any material that is suitable for the conduction of an electrical charge such as a stainless steel or aluminum alloy, copper, manganese (albeit too soft and prohibitively expensive. Optionally, the claws or clamp may be coated or covered with an insulating material such as a composite rubber or plastic.

Referring now to FIG. 2, the alkaline power indicator device of the present invention is shown from an elevated side view in an exploded perspective so that all separate elements that comprise the device can be seen in their spacial connective relationship to each other. The vertically aligned dotted lines establish the way in which the respective parts fit together in alignment. The pivot/rivet pin 14 extends upwards though holes or apertures 9, 11 that are formed within the proximal ends of the pivotable arms 16, 22 of the device. Preferably, the clamp arms are claw-like in shape about six (6) to ten (10) centimeters in length made of a conducting metal, with bored 1 mm diameter holes at the proximal ends. Two round rubber washers 20 are placed or inserted in alignment with the vertical axis as defined by the dashed lines. The upper washer 20*a* and contact shield 18*a* are placed between the planar surface of the upper claw-shaped arm 22 and the electrical conduit socket 24 of the power source indicator bulb 26.

In order to assemble the indicator device 10 so that a complete, insulated internal circuit is achieved, both arms or claws 16, 22 of the clamp 10 must be connected to the bulb receptacle (or light emitting device base) 24 while isolating each from direct contact with the other so that no short circuit occurs. To do this, one arm or claw (16 or 22) is connected to the casing of the receptacle 24 while the other is connected to the bottom connector 14. Preferably, the bulb receptacle is a small (½" diameter) screw-in bulb base as is known in the art although it can also be bayonet style or clamp-on style for an LED (diode) or other type bulb or light emitting device. Each arm/claw is subsequently isolated with two (2) substantially round rubber washers 20*a*, 20*b*, each with a 1 mm hole in middle thereof. These are placed vertically under the receptacle, between each claw. A six (6) to ten (10) mm long "T" shaped rivet with a 1 mm diameter mast provides a central axis post which is inserted in the centrally located holes of the other parts. An electrical contact 28 is located within the socket 24 at its' base and assists in passing currant from the battery to the bulb 26 for illumination Referring now to FIG. 3, a top, downward-oriented two-dimensional view of the alkaline power cell indicator device is shown operationally-connected to a standard "C" or "D" cell battery 12 that is commercially available and well known in the art. This is a close-up of the device 10 that is the same as that shown in FIG. 1 albeit from a different perspective. Two curved claw-like arms 16, 22 are made of a electrically conducting alloy metal. As indicated by the swivel arrow A, the arms rotate from a common point at their proximal end 23 where the rivet pin 14 (not shown) protrudes upwardly through and thereby secures and joins the different parts of the assembly. It is also here at the junction of the proximal ends of the arms 23, that the light-emitting bulb receptacle 24 (preferably screw- or bayonet style or clamp on style) receives the bulb 26 or an LED (also known in the art as a diode or any type of light emitting device rated between 1 volt and 9 volts). At the distal end of the arms/claws 16, 22, each arm forms an inward curved prong that comprises the pointed tips 6, 8 that will connect to the anode and cathode disposed at each end of the single cell battery 12. Suitable battery types that may be tested range from AA, AAA, C, D, to all flat batteries included in watches, clocks, and electronic devices. It can help test all stick style batteries, button batteries and even rechargeable batteries. Equipped with a 9 volt rated bulb, LED, or diode, this battery tester will detect the energy left in the 9-volt battery.

In order to measure or detect a charge, each arm or claw 16, 22 of the clamp 10 is closed as shown by "a" arrows together so that each of the contact points 6, 8 touches and connects to one pole of the battery casing. One point connect to the bottom of the casing which connects to the cathode (negative) end of the battery, the other claw will connect with the opposite pole of the bulb casing which will connect to the anode (positive) end of the battery. Generally, the battery is held in one hand and the tester in the other and the claws are then opened to the required dimensions of the battery. The clamp is then manually closed and when the prong or tip 6 of the first claw contacts the bottom of the battery (negative end), the other prong or tip 8 of the second arm or clamp will connect with the top of the battery (positive end). If there is energy left, contact will be made and the bulb will be lit. If contact is made and no illumination occurs, the battery is dead. However, any illumination that does occur is indicative that a charge is present. The strength of any illumination that does occur is a direct function of the degree of charge left in the cell. Once the operation if testing is finished, the claws are opened; the battery is either kept or discarded properly.

Referring now to FIG. 4, the alkaline power indicator device of the present invention 10 is shown from a cross-sectional side view along the line 4-4 shown in FIG. 1 so that the separate elements that comprise the device can be seen from another perspective, relative to the vertical axis. The indicator light or bulb 26 is shown inserted in the socket 24 and just like conventional light bulbs found in lamps and wall sockets in the home, in this embodiment the bulb stem 27 is ribbed around its' sides so that the bulb 26 may be screwed into and secured to the device for operation and use. When inserted in this manner and tightened, the indicator light electrical contact point 29 at the base of the bulb stem 27 touches and presses down on the circuit contact 28 to complete the electrical circuit of the device. The pivot/rivet pin 14 extends upwards though holes or apertures 9, 11 that are formed within the proximal ends of the pivot-able arms 16, 22 of the device. The upper round rubber washer 20*a* can be seen sandwiched between the socket 24 and the second contact shield 18*a* while the lower round rubber washer 20*b* can be seen sandwiched between the second or upper arm 22 and the lower contact shield 18*b*. The pivot pin 14 is centrally disposed and in contact with all eight (8) elements of the device. The pin 14 then, serves as the electrical conduit of the charge for the circuit to the indicator light bulb 26.

In order to assemble the indicator device 10 so that a complete, insulated internal circuit is achieved, both arms or claws 16, 22 of the clamp 10 must be connected to the bulb receptacle, i.e., the light emitting device base 24 while isolating each from direct contact with the other so that no short circuit occurs. To do this, one arm or claw (16 or 22) is connected to the casing of the receptacle 24 while the other is connected to the bottom connector 14. Preferably, the bulb receptacle is a small (½" diameter) screw-in bulb base as is known in the art although it can also be bayonet style or clamp-on style for an LED (diode) or other type bulb or light emitting device. Each arm/claw is subsequently isolated with two (2) substantially round rubber washers 20*a*, 20*b*, each with a 1 mm hole in middle thereof. These are placed vertically under the receptacle, between each claw. A six (6) to ten (10) mm long "T" shaped rivet with a 1 mm diameter mast provides a central axis post which is inserted in the centrally located holes of the other parts

What I claim is:
1. An electrical charge detection device comprising:
   a) at least two pivotally-movable, electrically conductive arms joined with a rivet pin at their proximal ends with curved tips at their distal ends;
   b) a light source mounted on the planar top surface of the proximal end of a first upper arm that is in contact with said pin;
   c) at least one rubber washer disposed between the proximal ends of said arms with a hole in middle for passage of said pin;

d) at least one metal clip or contact disposed between the washer and the interior planar surface of the first upper arm and a second lower arm that is contiguous with said pin and has a second hole for passage of said pin;

c) wherein the curved tips at the distal ends of the arms are equivalently angled to form inward curved prongs that will connect with each polar end of a power source.

2. The electrical charge detection device of claim 1 wherein the proximal ends of the electrically conductive arms pivot about the vertical axis of said pin.

3. The electrical charge detection device of claim 2 wherein said rivet pin connects and moveably fastens said first upper and said second lower electrically conductive arm to the light source.

4. The electrical charge detection device of claim 3 wherein said light source comprises and electrical socket receptacle for the removable insertion of a light bulb or other light emitting device base that illuminates upon the passage of an electrical charge from the distal ends of said first and second arms.

5. The electrical detection device of claim 4 wherein said washers isolate of the arms from direct contact with the other so no short circuit occurs.

6. The electrical detection device of claim 5 wherein rivet pin enters the base of the electrical socket receptacle so as to be electrically conductive therewith.

7. The electrical detection device of claim 6 wherein said light source is a light bulb, an LED or diode whose degree of illumination is a direct function of the amount of electric power generated by the power source.

8. The electrical detection device of claim 7 wherein said rivet pin is T-shaped.

9. The electrical detection device of claim 8 wherein the rivet pin is inserted through both planar surfaces of the proximal ends of the arms.

10. The electrical detection device of claim 9 wherein said the cap of the T-shaped rivet pin is flush against the bottom planar side of the lower second arm.

11. A method for measuring the presence and amount of electrical charge in a dry cell alkaline battery using the device of claim 1.

* * * * *